United States Patent
Murakami et al.

(10) Patent No.: US 9,951,415 B2
(45) Date of Patent: Apr. 24, 2018

(54) FILM DEPOSITION APPARATUS AND FILM DEPOSITION METHOD

(71) Applicants: CANON TOKKI CORPORATION, Niigata (JP); CANON KABUSHIKI KAISHA, Tokyo (JP)

(72) Inventors: Yasuo Murakami, Fujisawa (JP); Kazuhiro Hoshino, Utsunomiya (JP); Toru Sato, Ebina (JP); Takashi Takemi, Nagaoka (JP); Satoshi Nakamura, Nagaoka (JP); Tomohiro Kumaki, Nagaoka (JP)

(73) Assignees: Canon Tokki Corporation, Niigata (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/132,396

(22) Filed: Apr. 19, 2016

(65) Prior Publication Data

US 2016/0312353 A1   Oct. 27, 2016

(30) Foreign Application Priority Data

Apr. 22, 2015  (JP) ................. 2015-087616

(51) Int. Cl.
*C23C 14/34* (2006.01)
*C23C 14/54* (2006.01)
(Continued)

(52) U.S. Cl.
CPC ............ *C23C 14/54* (2013.01); *C03C 17/245* (2013.01); *C23C 14/0042* (2013.01);
(Continued)

(58) Field of Classification Search
CPC ................................... H01J 37/342
See application file for complete search history.

(56) References Cited

U.S. PATENT DOCUMENTS 5,096,562 A   3/1992  Boozenny et al.
5,645,699 A * 7/1997  Sieck ................. H01J 37/3405
                                            204/192.12

(Continued)

FOREIGN PATENT DOCUMENTS

JP   S61-37964 A   2/1986
JP   H05-504373 A  7/1993
(Continued)

OTHER PUBLICATIONS

Berg, S., et al., "Modeling of Reactive Sputtering of Compound Materials", J. Vac. Sci. Technol. A, vol. 5, No. 2, (1987) 202-207.
(Continued)

Primary Examiner — Jason Berman
(74) Attorney, Agent, or Firm — Fitzpatrick, Cella, Harper & Scinto

(57) ABSTRACT

A film deposition apparatus comprises: a vacuum chamber; a cylindrical target, a circumferential surface of the target being opposite to a substrate, and the target being disposed in the vacuum chamber so as to intersect a conveyance direction of the substrate; a driving unit configured to rotatively drive the target; a magnetic field creator disposed inside the target; a reactive gas flow unit configured to flow a reactive gas, the reactive gas flow unit being disposed in the vicinity of the target; an optical emission monitor configured to monitor an optical emission intensity of plasma at a location between the substrate and the target and in the vicinity of the target; and a controlling unit configured to control a rotation speed of the target driven by the driving unit, such that the optical emission intensity monitored by the optical emission monitor approaches a preset target optical emission intensity.

2 Claims, 6 Drawing Sheets

(51) Int. Cl.
*C23C 14/35* (2006.01)
*H01J 37/34* (2006.01)
*C23C 14/00* (2006.01)
*C23C 14/56* (2006.01)
*C03C 17/245* (2006.01)
*H01J 37/32* (2006.01)

(52) U.S. Cl.
CPC ............ *C23C 14/352* (2013.01); *C23C 14/56* (2013.01); *H01J 37/3299* (2013.01); *H01J 37/32449* (2013.01); *H01J 37/32972* (2013.01); *H01J 37/342* (2013.01); *H01J 37/3405* (2013.01); *C03C 2217/213* (2013.01); *C03C 2218/154* (2013.01)

(56) References Cited

U.S. PATENT DOCUMENTS

| | | | |
|---|---|---|---|
| 6,338,779 | B1 | 1/2002 | Shi et al. |
| 6,488,824 | B1* | 12/2002 | Hollars ............... C23C 14/35 204/192.12 |
| 6,783,640 | B2 | 8/2004 | Yamashita et al. |
| 8,992,742 | B2 | 3/2015 | Linss et al. |
| 9,721,769 | B2 | 8/2017 | Price |
| 2002/0134670 | A1 | 9/2002 | Echizen et al. |
| 2009/0071818 | A1 | 3/2009 | Fukumiya et al. |
| 2012/0164051 | A1* | 6/2012 | Bruns ............... C23C 14/0078 423/325 |
| 2015/0008120 | A1* | 1/2015 | Price ............... C23C 14/3407 204/298.09 |

FOREIGN PATENT DOCUMENTS

| | | |
|---|---|---|
| JP | 2002-212720 A | 7/2002 |
| JP | 2006-299361 A | 11/2006 |
| JP | 2012-530851 A | 12/2012 |
| KR | 10-2014-0072492 A | 6/2014 |
| KR | 10-2014-0117478 A | 10/2014 |

OTHER PUBLICATIONS

Office Action dated Apr. 19, 2017, in counterpart Korean Patent Application No. 10-2014-0043952 (11 pages including partial English translation).

Office Action dated Sep. 4, 2017, in counterpart Taiwan Invention Patent Application No. 105111093 (8 pages including English translation).

Office Action dated Oct. 26, 2017, in counterpart KR application 10-2016-0043952 (5 pages).

* cited by examiner

FILM DEPOSITION APPARATUS AND FILM DEPOSITION METHOD

BACKGROUND OF THE INVENTION

Field of the Invention

The present invention relates to film deposition apparatus and method which perform reactive sputtering.

Description of the Related Art

Conventionally, in the field of film deposition (or film preparation) for wide-area substrates such as flat display panel, a solar battery panel, glass for architectural materials, automotive glass and the like, magnetron sputtering using a flat-plate rectangular target has been performed.

In the magnetron sputtering, a magnetic field creator is disposed (or located) on the periphery of the target (mainly at the back side) to cause electrons to perform motion called E×B drift by a magnetic field (B) created by the magnetic field creator and an electric field (E) applied to the target. Thus, the sputtering is performed with high efficiency by increasing the electron density with use of the E×B drift of the electrons.

On the other hand, owing to requests of lowering costs and increasing productivity, reactive sputtering of depositing a compound thin film to a substrate by sputtering a metal target or the like with DC discharge under introduction of a reactive gas (e.g., $O_2$) has been widely used. Here, the compound thin film is used to add an insulating function and an antireflection function to, for example, a glass substrate or a different-use film deposited on the glass substrate.

In the reactive sputtering, it has been known that three states respectively having different film deposition speeds and different film qualities exist as the surface states of a target. The three states include a metal state, a reactive state (compound state) and a transition state between the metal state and the reactive state. In the reactive sputtering, a hysteresis exists in a change of the state at the time when a reactive gas flow rate is changed. As for such a hysteresis phenomenon, the theory of S. Berg and the like of modeling reactive gas balance has been known (see S. Berg, H. O. Blom, T. Larsson, and C. Nender: J. Vac. Sci. Technol. A, 5 (1987), 202).

Incidentally, in the magnetron sputtering using the flat-plate rectangular target, it has been known that the plasma density increases in the vicinity position of the E×B drift of the electrons, the film deposition speed increases at the point where the plasma density increases, and thus the film thickness distribution on the substrate become nonuniform (or uneven). To solve such inconvenience, Japanese Patent Application Laid-Open No. S61-037964 (hereinafter called Patent Literature 1) proposes the method of performing feedback control of a reactive gas flow rate by monitoring plasma emission. This method has been called Plasma Emission Monitoring, Optical Emission Monitoring, or the like (hereinafter, the relevant method is called PEM). To control the film thickness distribution on the substrate, it is important to control the degree of a compound in the target surface by controlling the flow rate of reactive gas. Namely, it is important to control balance between metallization by the sputtering on the target surface and compoundization by the reactive gas.

Japanese Patent Application Laid-Open No. H05-504373 (hereinafter called Patent Literature 2) proposes the film deposition apparatus in which a cylindrical target called a rotary cathode is used instead of a flat-plate rectangular target in order to improve process stability and a use efficiency of materials. In the Patent Literature 2, the conveyance direction of the substrate and the rotation axis of the target are orthogonalized, and the thin film is deposited on the substrate by rotating the target while conveying the substrate. Incidentally, in addition to the rotary cathode, the above cylindrical target is variously called a cylindrical rotary magnetron cathode, a cylindrical cathode, or the like. Also, in case of depositing the thin film on the substrate by the reactive sputtering using the cylindrical target, the film thickness distribution depends on the coating ratio of the compound (e.g., metal oxide) in the target surface.

Japanese Patent Application Laid-Open No. 2012-530851 (hereinafter called Patent Literature 3) proposes the method of controlling the coating ratio of a compound on the surface of a cylindrical target by using the PEM up to now in case of performing the reactive sputtering in the target.

In the Patent Literature 1, although the flat-plate rectangular target is used, the method of adjusting the reactive gas amount supplied from each gas introduction port while measuring plasma emission to uniformize the film thickness distribution on the substrate has been proposed. It is conceivable to control the reactive gas flow rate by the PEM in the cylindrical target, by applying the method of the Patent Literature 1 to the Patent Literature 2.

However, when the reactive gases are supplied to the target from the plurality of the gas introduction ports respectively, these gases supplied from the different gas introduction ports intermix and thus interfere with others. Due to such complicated mutual interference, it was difficult only by control of the reactive gas flow rate to uniformize the degree of the compound on the target surface in the rotation axis direction. Moreover, since the cylindrical target rotates, there was a problem that the degree of the compound on the target surface becomes nonuniform also in the rotation direction and thus the film deposition speed becomes nonuniform. As a result, in the conveyance direction of the substrate and the width direction intersecting the conveyance direction of the substrate, the film thickness distribution of the thin film on the substrate was nonuniform. That is, in order to achieve uniformization of the film thickness distribution on the substrate, it was necessary to uniformize the degree of the compound in the rotation direction (circumferential direction) and the direction of the rotation axis on the target surface.

On the other hand, in the Patent Literature 3, to prevent generation of a striped film, the method of matching the period by which the target voltage is changed with the rotation of the target has been proposed in addition to the flow rate control of the reactive gas. However, although it was possible to prevent that the striped film is generated in the conveyance direction of the substrate, it was necessary to provide another improving method for uniformizing the film thickness distribution in the width direction on the substrate.

SUMMARY OF THE INVENTION

The present invention aims to provide film deposition apparatus and method of uniformizing a film thickness distribution in the conveyance direction of a film deposited on a substrate and the direction perpendicular to the conveyance direction, when performing reactive sputtering using a cylindrical target.

According to an aspect of the present invention, there is provided a film deposition apparatus comprising: a vacuum chamber; a cylindrical target, a circumferential surface of the target being opposite to a substrate, and the target being disposed in the vacuum chamber so as to intersect a conveyance direction of the substrate; a driving unit configured to rotatively drive the target; a magnetic field creator disposed inside the target; and a reactive gas flow unit configured to flow a reactive gas, the reactive gas flow unit being disposed in the vicinity of the target, wherein the film deposition apparatus further comprises an optical emission monitor configured to monitor an optical emission intensity (amount) of plasma at a location between the substrate and the target and in the vicinity of the target, and a controlling unit configured to control a rotation speed of the target driven by the driving unit, such that the optical emission intensity monitored by the optical emission monitor approaches a preset target optical emission intensity.

According to another aspect of the present invention, there is provided a film deposition method by which a circumferential surface of a cylindrical target rotatively driven by a driving unit is opposite to a substrate, the target is disposed in a vacuum chamber such that a rotation axis of the target intersects a conveyance direction of the substrate, a compound is made on the surface of the target by flowing a reactive gas from a reactive gas flow unit disposed in the vicinity of the target when depositing a film on a surface of the substrate by a magnetron sputtering, and an optical emission intensity of plasma is monitored by an optical emission monitor at a location between the substrate and the target and in the vicinity of the target, the film deposition method comprising: obtaining the optical emission intensity monitored by the optical emission monitor; and controlling a rotation speed of the target driven by the driving unit, such that the obtained optical emission intensity approaches a preset target optical emission intensity.

Further features of the present invention will become apparent from the following description of exemplary embodiments with reference to the attached drawings.

DESCRIPTION OF THE EMBODIMENTS

Figure 1:
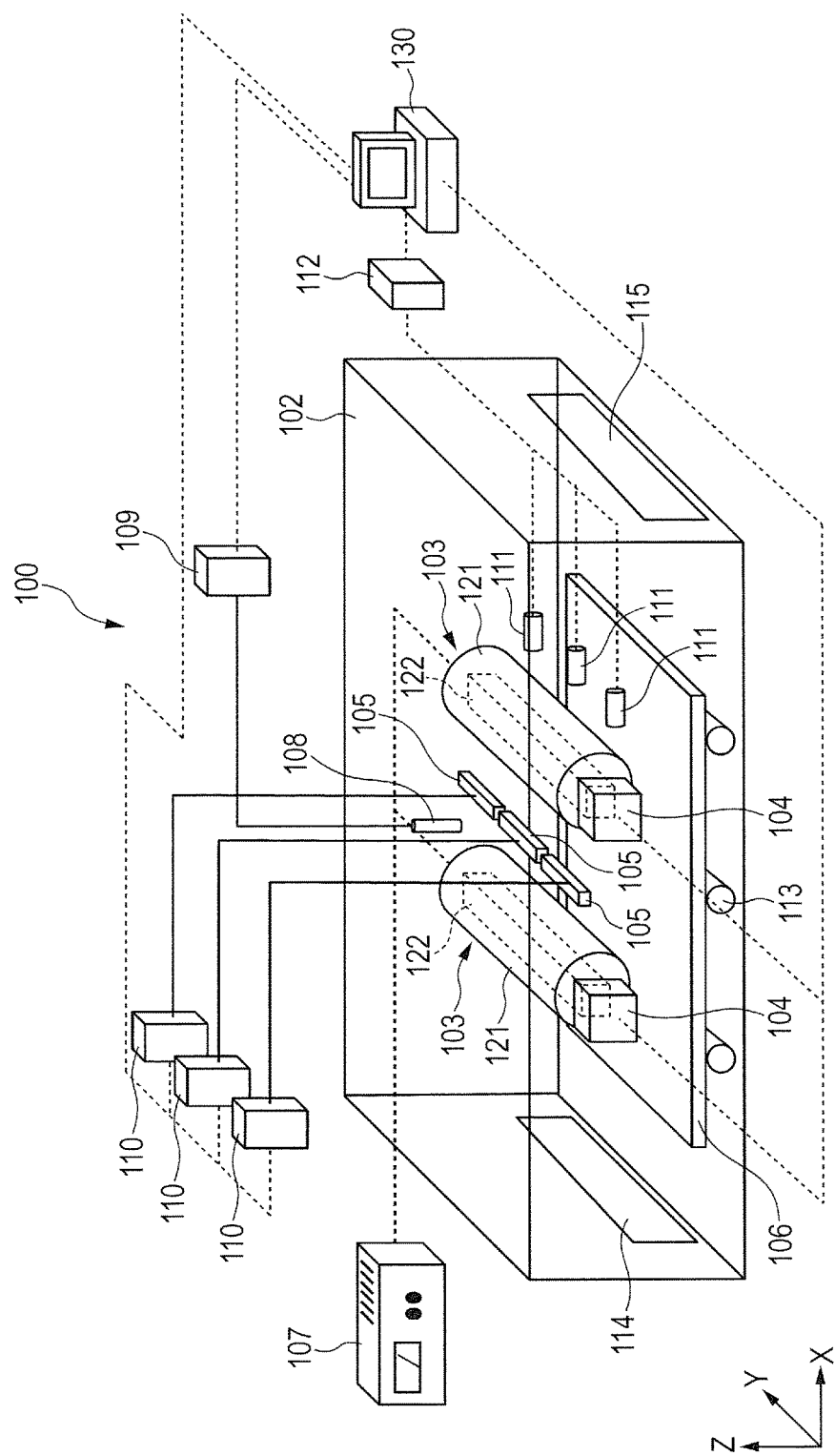
FIG. 1 is a diagram for describing a schematic constitution of a film deposition apparatus according to the embodiment of the present invention.
Figure 2:
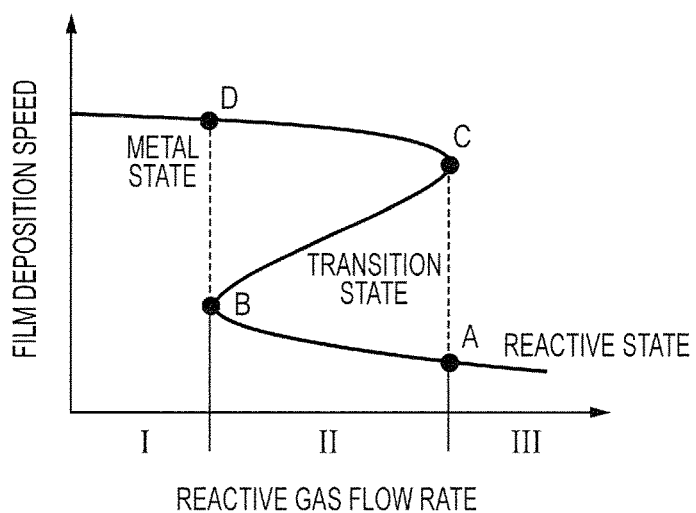
FIG. 2 is a graph for describing a film deposition speed to a reactive gas flow rate.

Hereinafter, the embodiments of the present invention will be described in detail in accordance with the accompanying drawings. FIG. 1 is a diagram for describing a schematic constitution of a film deposition apparatus according to the embodiment of the present invention. FIG. 2 is a graph for describing a film deposition speed to a reactive gas flow rate.

First, the relation between a reactive gas flow rate and a film deposition speed in reactive sputtering will be described with reference to FIG. 2. In the reactive sputtering, it has been known that the three states respectively having different film deposition speeds and different film qualities exist as the surface state of a target. The three states include a metal state, a reactive state (compound state) and a transition state between the metal state and the reactive state. The cause of existence of these three states is in a fact that the reactive gas reacts with atoms on the surface of the target and the surface of the target is coated with a compound.

In the reactive state, the reactive gas, of which the quantity is sufficient to maintain the compound on the surface of the target, exists (a gas flow rate region III in FIG. 2). In case of this reactive state, the compound, which satisfies a stoichiometric ratio in a state of sufficiently advancing the reaction, can be easily obtained, however, such a characteristic of delaying the film deposition speed appears as compared with the other two states. The bonding force of a compound film on the target or the bonding force between a target material and the compound film is larger than the bonding force of the target material such as the metal or the like. The more energy is necessary in order to obtain the compound by performing the sputtering to the target after breaking the bond. Therefore, a sputtering rate of the compound becomes lower than that of the metal, and the film deposition speed when depositing a film of the compound decreases. Furthermore, although secondary electrons are required to be supplied from the target in order to keep a sputtering phenomenon, the amount of secondary electrons emitted from the compound is treated as a secondary electron emission coefficient as the value unique to the substance. Generally, most of the secondary electron emission coefficients of the compounds are larger than those of the metals, and the discharge voltage decreases by this effect. That is, the acceleration energy of ions to be irradiated to the target decreases, and the film deposition speed of the compound decreases.

In the metal state, the reactive gas, of which the quantity is sufficient to make the compound on the surface of the target, does not exist (a gas flow rate region I in FIG. 2), and the surface of the target is in a state that the ratio of the metal becomes larger than that of the compound. As a result, although the film deposition speed increases, a thin film to be deposited becomes a metallic thin film which is in a state that the reaction is not sufficiently advanced. Therefore, the consequences of not realizing the necessary film function often occur because of the insufficient reaction.

In the transition state, the reactive gas, of which the quantity corresponds to such the quantity between the reactive state and the metal state, exists (a gas flow rate region II in FIG. 2). The compound is partially made on the surface of the target, and the compound sputtering and the metal sputtering are in a mixed state. Therefore, the film deposition speed increases as compared with a case of the reactive state. There is such the feature, where the compound of which the reaction is sufficiently advanced depending on the condition can be obtained. However, the transition state is an extremely unstable state.

A case of decreasing the reaction gas flow rate from the reactive state corresponding to a point A in FIG. 2 is considered. The surface of the target is coated with the compound until the state corresponding to a point B. In this area (the gas flow rate region II in FIG. 2), even if a metal surface appears by a process that the compound on the surface of the target is sputtered, the metal surface immediately reacts with the reactive gas and the surface is coated again with the compound. When the reactive gas flow rate is further decreased from the state corresponding to the point B, the reaction gas amount, which is required in making the compound on the metal surface which appears on the surface of the target, is lacked. Then, not only the compound sputtering but also the metal sputtering begins from the metal surface. The metal formed by the metal sputtering serves as a pump of the reactive gas (gettering effect), and a part of the reactive gas being introduced is consumed at the pump, and the reactive gas to be used in the reaction performed on the metal surface of the target is further lacked. As a result, a ratio of the metal state on the surface of the target rapidly increases, and the state shifts from the point B of the compound state to a point D of the metal state as indicated by the broken line. Also in case of increasing the reactive gas flow rate from the metal state, a rapid state change similarly occurs, and the state shifts from a point C of the metal state to the point A of the reactive state along the broken line. As a result, in the reactive sputtering, the hysteresis is constituted.

A film deposition apparatus 100 illustrated in FIG. 1 deposits a compound thin film (e.g., an antireflection film) on the surface of a substrate 106, on which the film is to be deposited, by the magnetron sputtering according to the reactive sputtering. Incidentally, the X-Y-Z directions indicated in FIG. 1 are mutually orthogonal directions.

The film deposition apparatus 100 has a vacuum chamber 102, cathode units 103 and driving units 104. Further, the film deposition apparatus 100 has reactive gas flow units 105, an AC power supply 107, an inert gas flow unit 108, a mass-flow controller 109, mass-flow controllers 110, an optical emission monitor 111, a spectroscope 112, a conveying device 113 and a controlling apparatus 130.

A carry-in port 114 used for carrying the substrate 106 from the outside into the inside and a carry-out port 115 used for carrying the substrate 106 from the inside to the outside are formed at the vacuum chamber 102. A load lock chamber (LL chamber), which is not illustrated, is connected to the carry-in port 114.

The conveying device 113 is disposed at the inside (and the outside) of the vacuum chamber 102. The conveying device 113 carries the substrate 106 into the inside of the vacuum chamber 102 through the carry-in port 114 and conveys the substrate 106 while a film is depositing on the surface of the substrate 106 at the inside of the vacuum chamber 102 and then carries the substrate 106 to the outside of the vacuum chamber 102 through the carry-out port 115 after depositing the film. The conveying direction of the substrate 106 conveyed by the conveying device 113 is assumed as the X-direction. The conveying device 113 is constituted by, for example, rollers and the like. The conveying device 113 may have a conveyance holder on which the substrate 106 is mounted. In this case, it is desirable to have a mechanism of suppressing a plasma change at the minimum level when the substrate is carried into the inside by electrically insulating the conveyance holder.

The cathode units 103 have cylindrical targets 121, which are the sputtering sources, disposed at the inside of the vacuum chamber 102 and magnetic field creators 122 disposed at the inner sides of the targets 121. The targets 121 are composed of the metal (e.g., Si). In the present embodiment, each of the cathode units 103 (targets 121) is a long object, of which a longitudinal direction is the rotation-axis direction.

The targets 121 are disposed at the inside of the vacuum chamber 102 with the state of intersecting (orthogonally intersecting) to the conveying direction of the substrate 106 (X-direction) such that the circumferential surface of the each of the targets 121 is opposite to the substrate 106. That is, the targets 121 are disposed at the inside of the vacuum chamber 102 such that the rotation axis of the each of the targets 121 becomes parallel to the Y-direction which intersects (orthogonally intersects) with the X-direction.

The driving units 104, which are disposed at the outside of the vacuum chamber 102 and connected with the targets 121 through the wall part of the vacuum chamber 102, rotationally drive the targets 121. The magnetic field creators 122 are fixed to the vacuum chamber 102 by support members, which are not illustrated. In the present embodiment, the film deposition apparatus 100 has a pair of the cathode units 103 and a pair of the driving units 104. The pair of the cathode units 103 is disposed in the conveying direction (X-direction) with a state of having an interval. The each of the driving units 104 can independently adjust the rotation speed (including the rotation direction) of the each of the targets 121.

The reactive gas flow units 105 are disposed at the inside of the vacuum chamber 102. The mass-flow controllers 110, which are the reactive gas sources and flow rate control units, are disposed at the outside of the vacuum chamber 102. The reactive gas flow units 105 are connected with the mass-flow controllers 110 by gas pipes. The mass-flow controllers 110 output the reactive gas while controlling the reactive gas flow rate. The reactive gas is, for example, the oxygen ($O_2$) gas.

The each of the reactive gas flow units 105, which is formed with the state of extending to the rotation-axis direction (Y-direction) of the each of the targets 121, has one or more flow ports (in the present embodiment, plurality of flow ports) which flow the reactive gas supplied by the each of the mass-flow controllers 110 to the inside of the vacuum chamber 102. The flow ports are formed with the state of opening to the direction of the substrate 106 (-Z-direction). The reactive gas flow units 105 are disposed in the vicinity of the targets 121. The reactive gas flowed from the each of the reactive gas flow units 105 combines with the metal on the surface of the each of the targets 121, and the metal oxide, which is the compound, for example, $SiO_2$ is made.

The plurality of the reactive gas flow units 105 are disposed in the rotation-axis direction (Y-direction) of the targets 121 with the state of having an interval with each other. The mass-flow controllers 110, of which the number is the same as that of the reactive gas flow units 105, are disposed. In the present embodiment, the number of the reactive gas flow units 105 and the number of the mass-flow controllers 110 are respectively three. The reactive gas flow units 105 are connected with the mass-flow controllers 110 by pipes in a manner of the one-to-one relationship. Therefore, the amount of gas to be flowed from the each of the reactive gas flow units 105 can be independently adjusted by the each of the mass-flow controllers 110.

As the reactive gas, it is not limited to the oxygen ($O_2$) gas but, for example, the nitrogen ($N_2$) gas is also available.

The inert gas flow unit 108 is disposed at the inside of the vacuum chamber 102. The mass-flow controller 109, which is the inert gas source and an inert gas flow rate control unit, is disposed at the outside of the vacuum chamber 102. The inert gas flow unit 108 is connected with the mass-flow controller 109 by the gas pipe. The mass-flow controller 109 outputs the inert gas while controlling the inert gas flow rate. The inert gas is, for example, the Ar (argon) gas which is the rare gas.

The inert gas flow unit 108 has a flow port which flows the inert gas supplied from the mass-flow controller 109 to the inside of the vacuum chamber 102. The inert gas flow unit 108 is disposed in the vicinity of the targets 121. The Ar gas flowed from the inert gas flow unit 108 is ionized to become inert gas ions (e.g., Ar ions) by the electric discharge. Sputtering particles (e.g., $SiO_2$ particles) are emitted from the targets 121 by a process that these inert gas ions collide with the surfaces of the targets 121. Then, a thin film, for example, a $SiO_2$ film which is an oxide film is deposited on the substrate 106 by the phenomenon that the sputtering particles adhere to the surface of the substrate 106.

As the inert gas, it is not limited to the Ar gas if it is the inert gas having the mass capable of industrially performing the sputtering. That is, such the inert gas, which is consisted of at least one gas among the Ne gas, Ar gas, Xe gas, Kr gas and Rn gas, is available. Specifically, one kind of gas or the mixed gas consisted of two or more kinds of gases among the Ne gas, Ar gas, Xe gas, Kr gas and Rn gas is also available.

In the present embodiment, when the oxide film is deposited, the oxide film charges up as an insulator. Consequently, such a state of easily generating the abnormal discharge occurs. Therefore, as the method of suppressing the abnormal discharge, an AC system for alternately applying the AC voltage to a pair of the targets 121 by the AC power supply 107 is adopted by treating two pieces of the cathode units 103 as one pair of the cathode units. In order to reach the thickness of the thin film to be deposited on the substrate 106 the total film thickness, it may be constituted that plurality of sets of the pair of the cathode units 103 are disposed in the conveying direction (X-direction) if necessary.

The each optical emission monitor 111, which monitors an optical emission intensity (amount) of plasma, is a monitor unit having a collimate lens. The plurality of the optical emission monitors 111 (in the present embodiment, three units) are disposed in the rotation-axis direction of the targets 121 (Y-direction) with the state of having intervals. The optical emission monitors 111, which are disposed in the vicinity of the target 121, monitor the optical emission intensity of plasma in the vicinity of the surfaces of the targets 121 between the surface of the substrate 106 and the surfaces of the targets 121.

It is desirable that at least the three optical emission monitors 111 are disposed in a manner that the one unit is disposed at the center position of the longitudinal direction (Y-direction) of the target 121 and other units are disposed at peripheral positions of the center position. Each of the peripheral positions may be at the center side from the just above of the portion required to ensure the thickness of the film to be deposited on the substrate 106. As for the method of disposing the optical emission monitor 111, the optical emission monitor 111 may be disposed at the peripheral position of at least the one cathode unit 103 for the two cathode units 103. In this case, the optical emission monitors 111 are disposed so as to be able to observe the plasma in the horizontal direction (in FIG. 1, -X-direction) to the substrate 106.

The spectroscope 112 is disposed at the outside of the vacuum chamber 102. The respective optical emission monitors 111 are connected to the spectroscope 112 through, for example, an optical fiber. In addition, the spectroscope 112 is connected to the controlling apparatus 130 which is a controlling unit. The spectroscope 112 spectrally disperses the plasma emission, which was input, and converts the spectrally dispersed emission into an electric signal for each the wavelength and then outputs the converted signal to the controlling apparatus 130.

The controlling apparatus 130 is an information processing terminal constituted by a computer. The controlling apparatus 130 obtains a signal, which indicates the optical emission intensity of plasma monitored at the optical emission monitor 111, through the spectroscope 112. As for a wavelength range necessary for the spectroscope 112, it may be such a range capable of obtaining a spectrum of the range which includes the wave length necessary in the measurement. The controlling apparatus 130 selectively obtains data of the optical emission intensity of a certain specific wavelength in a region including ultraviolet rays, visible rays and infrared rays from data of the optical emission spectrum spectrally dispersed at the spectroscope 112. Incidentally, although it is not illustrated, it may be constituted that only the optical emission intensity of the specific wavelength is selected and obtained by using a band-pass filter and a photomultiplier instead of the spectroscope 112.

Figure 3:
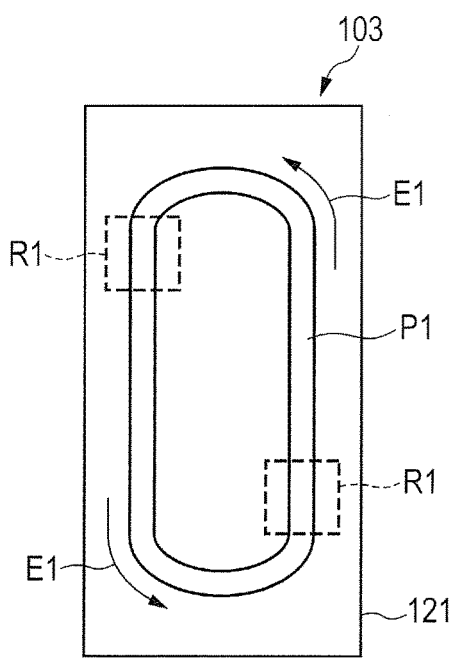
FIG. 3 is a diagram for describing movement of electrons and plasma density in a cathode unit.

FIG. 3 is a diagram for describing movement of electrons and plasma density in the cathode unit 103. Electrons move on the targets 121 in the counterclockwise direction E1 by the E×B drift of electrons according to the magnetic field creators 122 illustrated in FIG. 1. In a process of that movement, a plasma P1 is generated, and the sputtering occurs at that plasma generated place. At this time, it is generally known that a remaining time of electrons is increased due to the change of a magnetic field or the like in a place R1 where the drift directions of the electrons are changed. In this place R1, plasma density increases, and a film deposition speed tends to become a high speed as a result of increasing the plasma density.

A case that the rotation speed of the target 121 is fixed at a constant speed to become a certain value is assumed. The nonuniformity (or unevenness) of the film deposition speed sometimes occurs at the cylindrical targets 121 also between places R1 and R1, where the drift directions of the electrons are changed, from the nonuniformity of the degree of compound on the surface of the each of the targets 121 depending on the rotation direction, in addition to the nonuniformity of the film deposition speed due to the magnetic field creators 122. As a result, the nonuniformity (i.e., asymmetry) of film thickness distribution on the substrate 106 sometimes occurs in the direction parallel to the rotation axis of the target 121 (Y-direction), that is, in the width direction.

The optical emission intensity monitored at the optical emission monitor 111 and the state of the compound on the surface of the target 121, that is, the film deposition speed are in the correspondence relation, and the state of the compound on the surface of the target 121 can be controlled by controlling the rotation speed of the target 121.

Therefore, in the present embodiment, the controlling apparatus 130 treats the value of the obtained optical emission intensity (amount) as the control amount. The rotation speed (including the rotation direction) of the each target 121 is controlled by feedback control such as a PID (Proportional Integral Differential) control such that this control amount is stably maintained to become a previously set target value (target optical emission intensity). That is, the controlling apparatus 130 controls the rotation speed of the targets 121 due to the drive of the driving units 104 such that the respective optical emission intensities monitored by the respective plurality of the optical emission monitors 111 approach the previously set target optical emission intensity.

Although it is difficult to coincide (match) all of the optical emission intensities respectively monitored by the plurality of the optical emission monitors 111 with the target optical emission intensity, the optical emission intensities can be shifted such that the optical emission intensities monitored at the optical emission monitors 111 approach the target optical emission intensity by controlling the rotation speed of the targets 121. As a result of the above control, all of the optical emission intensities can be kept within an allowable range of the target optical emission intensity. Incidentally, it may be controlled that the controlling apparatus 130 calculates the average of values of the optical emission intensities monitored at the plurality of the optical emission monitors 111 such that the average value approaches the target optical emission intensity. In addition, the number of the optical emission monitors 111 may be one, and in this case, the controlling apparatus 130 may perform the control such that the optical emission intensity monitored at the one optical emission monitor 111 approaches the target optical emission intensity.

In this manner, by controlling the rotation speed of the target 121, the degree of compound on the surface of the target 121 can be uniformized to the target degree, and the film thickness distribution in the width direction of the substrate 106 can be uniformized. Further, the film thickness distribution in the conveying direction of the substrate 106 also can be uniformized by controlling the rotation speed of the target 121 in the course of conveying the substrate 106. Therefore, according to the present embodiment, when performing the reactive sputtering by using the cylindrical targets 121, the film thickness distributions in the conveying direction and the direction perpendicular to the conveying direction of the film to be deposited on the substrate 106 can be uniformized.

Figure 4:
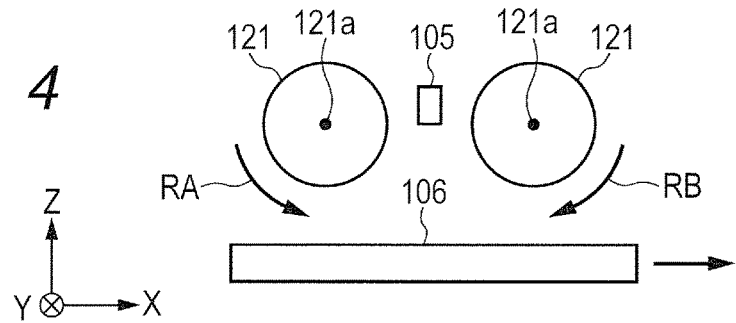
FIG. 4 is a diagram for describing a pair of targets and a reactive gas flow unit viewed from the direction along which the rotation axis of the targets extend.

FIG. 4 is a diagram for describing a pair of the targets 121 and the reactive gas flow units 105 viewed from the direction (Y-direction) along which the rotation axes of the targets 121 extend. As described above, the film deposition apparatus 100 has the pair of the targets 121. Although the rotation direction of the pair of the targets 121 may be set as the same direction with each other, in the present embodiment, the rotation direction of the pair of the targets 121 is set as the reverse direction with each other. That is, the controlling apparatus 130 controls the rotation speed of the each target 121 according to the drive of the each driving unit 104 such that the pair of the targets 121 rotate in the reverse direction with each other. In FIG. 4, the rotation direction RA of the target 121 at the upstream side in the conveying direction of the substrate 106 is set as the direction which is the same as the conveying direction of the substrate 106, and the rotation direction RB of the target 121 at the downstream side in the conveying direction of the substrate 106 is set as the direction which is inverse to the conveying direction of the substrate 106 in the pair of the targets 121.

In a case that the rotation direction of the pair of the targets 121 is set as the same direction, the sputtering is performed after the reactive gas was supplied in the one target 121, and the sputtering is performed before the reactive gas is supplied in the other target 121. Therefore, the film deposition speed according to the one target 121 becomes lower than the film deposition speed according to the other target 121, and the dispersion easily occurs in the film quality.

On the other hand, in the present embodiment, since the rotation direction of the pair of the targets 121 is set as the reverse direction with each other, the sputtering is performed after the reactive gas was supplied or before the reactive gas is supplied in the both targets 121. Therefore, the film deposition speed according to the respective targets of the pair of the targets 121 approximates with each other, and the film quality in the substrate 106 can be uniformized.

As illustrated in FIG. 4, the each of the reactive gas flow units 105 is disposed on a position between the cathode units 103 (target units 121), which constitute one pair by the two pieces, and disposed on the side farther than the position of the substrate 106 to the rotation axes 121a.

That is, the each of the reactive gas flow units 105 (specifically, each of flowing ports) is disposed on the side farther than a position of the each rotation axis 121a of the target 121 in the +Z-direction to the substrate 106, and the reactive gas is flowed to the side (−Z-direction) of the substrate 106. Further, it is desirable that the reactive gas flow units 105 (specifically, flowing ports) are disposed on the positions which do not exceed the size (circumference) of the targets 121 in the Z-direction. It is preferable that the reactive gas flow units 105 are disposed on at least the three portions, which are the both ends portions and the center portion, in the longitudinal direction (Y-direction) of the targets 121.

Further, in the present embodiment, the controlling apparatus 130 controls the flow rate of the reactive gas according to the each of the mass-flow controllers 110 in accordance with each of the optical emission intensities respectively monitored by the plurality of the optical emission monitors 111. Accordingly, the film thickness in the width direction of the substrate 106 can be more effectively uniformized.

Figure 5:
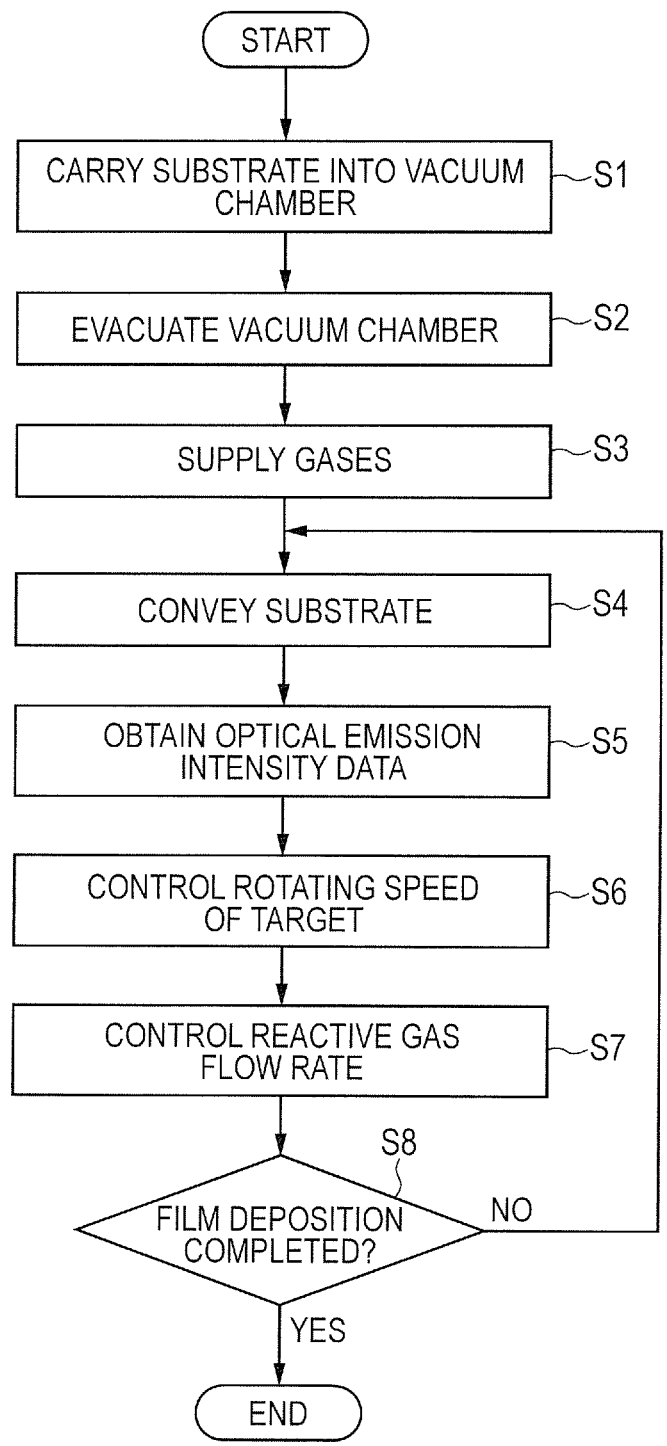
FIG. 5 is a flow chart for describing a film deposition method according to the embodiment.

Next, a processing procedure of depositing the oxide film (antireflection film) by using the film deposition apparatus 100 of the present embodiment will be described with reference to FIG. 5. FIG. 5 is a flow chart for describing a film deposition method according to the embodiment of the present invention.

First, after the vacuum chamber 102 illustrated in FIG. 1 is atmospherically opened, the substrate 106 is passed through the carry-in port 114 from the load lock chamber (LL chamber), which is not illustrated, and carried into the inside of the vacuum chamber 102 (S1: a substrate carrying-in step).

Next, the vacuum chamber 102 is evacuated to reach such a level equal to or less than $1\times10^{-3}$ [Pa] by using a vacuum pump which is not illustrated (S2: a vacuuming process).

Next, the rare gas such as the Ar gas or the like is supplied from the inert gas flow unit 108, and the oxygen ($O_2$) gas which is the reactive gas is supplied from the reactive gas flow units 105 at the same time (S3: a gas supplying step). In this case, the AC voltage is supplied to the pair of the cathode units 103, which constitute one pair by the two pieces, from the AC power supply 107 to start the electric discharge. In a case that contaminants or the oxides adhered to the surfaces of the targets 121 are required to be removed, the pre-sputtering is performed before conveying the substrate 106 to the region where the film is deposited.

The substrate 106 is conveyed at the inside of the vacuum chamber 102 (S4: a conveying step). The controlling apparatus 130 obtains the data of the optical emission intensities monitored at the optical emission monitors 111 in the course of conveying the substrate 106 (S5: an obtaining step).

Then, as described above, the controlling apparatus 130 controls the rotation speed of the targets 121 according to the drive of the driving units 104 such that the optical emission intensity approaches the target optical emission intensity which was previously set (S6: a speed controlling step).

Further, as described above, the controlling apparatus 130 controls the reactive gas flow rate according to the mass-flow controllers 110 in accordance with each of the optical emission intensities monitored by the respective plurality of the optical emission monitors 111 (S7: a flow rate controlling step).

The controlling apparatus 130 decides whether or not the film deposition of the substrate 106 is completed (S8: a deciding step), and when the film deposition is completed (Yes in S8), the substrate 106 is carried out from the vacuum chamber 102. When the film is currently deposited (No in S8), the flow returns to a process in S4.

In this manner, a thin film (e.g., an optical thin film) is deposited on the surface of the substrate 106 by an operation that the substrate 106 passes through the vicinity of the electrically discharged targets 121.

As described above, according to the present embodiment, the uniformization of the film thickness distribution in the Y-direction parallel to the rotation axes of the targets 121 can be attained in the substrate 106 by controlling an oxygen coating ratio of the targets 121.

EXAMPLES

Example 1

Next, the antireflection film was deposited on the glass substrate 106 under the following conditions at the film deposition apparatus 100 according to the above-described embodiment.
Substrate size: width 1,850 [mm]×length 1,250 [mm]×thickness 2.0 [mm]
Substrate holder: width 1,900 [mm]×length 1,400 [mm]
Substrate conveyance: 1,450 [mm/minute]
Exhaust mechanism: a turbo molecular pump, a dry pump
Power supply: AC system (40 [kHz])
Shape of target: diameter φ 190 [mm]×thickness 2,200 [mm]
Distance between targets: 90 [mm] (Distance between center portions of targets: 250 [mm])
Material of target: Si
Inert gas: Ar
Reactive gas: $O_2$
Reactive gas flow port: three-divided ports (both ends portions 490 [mm], center portion 1,130 [mm])
Ultimate pressure: $1×10^{-4}$ [Pa]

The Ar gas, which is the inert gas, is set to be introduced from the inert gas flow unit 108 into the vacuum chamber 102, and the reactive gas $O_2$ is set to be introduced from the reactive gas flow units 105 into the vacuum chamber 102.

As for the flow rate control of Ar gas, the flow rate was made constant at 300 [sccm] by using the mass-flow controller 109. The $O_2$ gas was supplied from three portions of the reactive gas flow units 105, as illustrated in FIG. 1, by using the respective mass-flow controllers 110.

Among the three reactive gas flow units 105 in the Example 1, the length of the reactive gas flow unit 105 disposed at the center portion was set as 1130 [mm], and the length of the reactive gas flow units 105 disposed at the both ends portions was set as 490 [mm]. The amount of the $O_2$ gas supplied from the reactive gas flow unit 105 disposed at the center portion was set as 32.5 [sccm], and the amount of the $O_2$ gas supplied from the reactive gas flow units 105 disposed at the both ends portions was set as 6.5 [sccm].

The total pressure of the mixed gas in the vacuum chamber 102 was made constant at 1.0 [Pa] by controlling the valve opening/closing amount for adjusting the pressure disposed at the connecting portion between the turbo molecular pump and the vacuum chamber 102.

The sputtering was performed by alternately applying the electricity of 6,000 [W] to the pair of the targets 121 by applying the AC voltage to the pair of the targets 121 by the AC power supply 107 by treating two pieces of the cathode units 103 as one pair of the cathode units.

The pair of the targets 121 were rotated at the rotation speed of 20 [rpm] by the driving units 104 before the electric discharge. In the pair of the targets 121, the rotation direction RA of the one target 121 was set as the same direction (forward direction) to the conveying direction of the substrate 106 as indicated in FIG. 4, and the rotation direction RB of the other target 121 was set as the reverse direction to the conveying direction of the substrate 106.

Next, the substrate 106 was disposed on a conveying tray of which the width is 1,900 [mm], and the substrate 106 was conveyed at the speed of 1450 [mm/minute]. The closest distance between the substrate 106 and the target 121 was set as 80 [mm]. After the substrate 106 was passed through the vacuum chamber 19 times with the electric discharge state, the vacuum chamber 102 was atmospherically opened.

Figure 6:
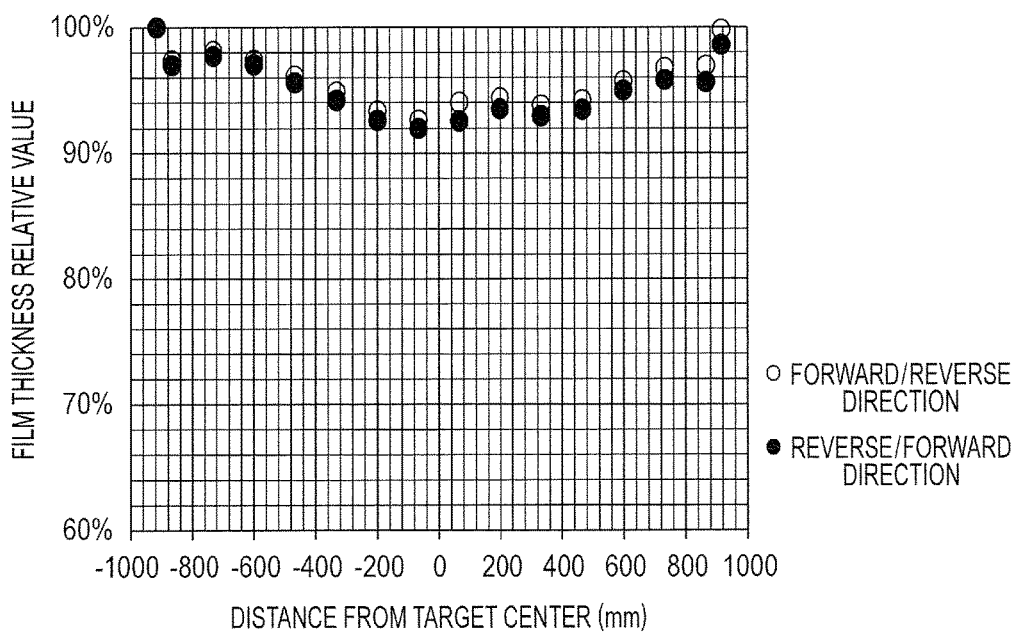
FIG. 6 is a graph for describing the result obtained by measuring the relative value of the film thickness to the width-direction distance from the center position of the substrate in Example 1.

The thickness of the optical thin film deposited on the substrate 106 was measured at 16 points totally in the width direction, that is, the eight points at intervals of about 130 [mm] toward the both ends in the width direction from the center position of the substrate 106 in regard to the conveyance direction, by using an optical film thickness meter. FIG. 6 is a graph for describing the result obtained by measuring the relative value of the film thickness to the width-direction distance from the center position of the substrate 106 in the Example 1. In FIG. 6, the relative values of the respective measured portions in a case that the maximum value of the measured film thickness is regarded as the reference are indicated.

In the Example 1, the maximum value of the film thickness when the two targets 121 were rotated in the forward/reverse direction was 103 [mm]. From this result, it was indicated that the film thickness distribution was equal to or less than ±4[%] at a region of the one side 916 [mm] in the width direction of the substrate 106.

As to the rotation direction, it was confirmed that the tendency was the same as that in the above-described result even under the condition that only the rotation direction of the two targets 121 was reversely changed about the forward/reverse direction.

Example 2

Figure 7:
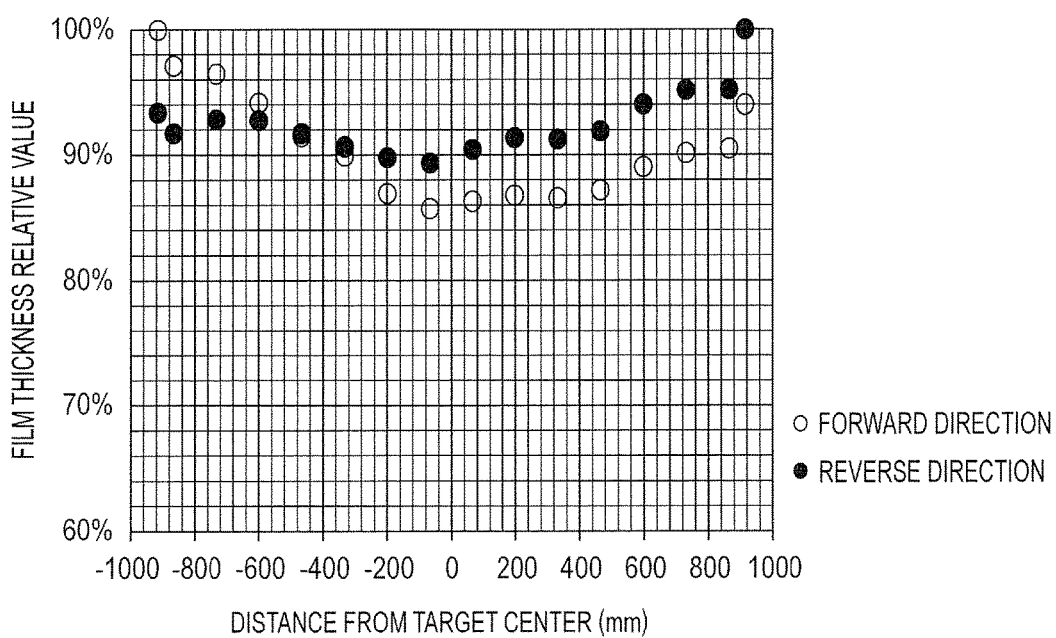
FIG. 7 is a graph for describing the result obtained by measuring the relative value of the film thickness to the width-direction distance from the center position of the substrate in Example 2.

As the Example 2, the antireflection film was deposited for a case that the rotation direction of the pair of the targets 121 was set as the direction, which is the same as the conveying direction of the substrate 106, for the both targets and a case that the above rotation direction was set as the direction, which is reverse to the above conveying direction, for the both targets. FIG. 7 is a graph for describing the result obtained by measuring the relative value of the film thickness to the width-direction distance from the center position of the substrate 106 in the Example 2.

As indicated in FIG. 7, the film thickness distribution in the width direction of the substrate 106 was about ±8[%] without depending on the rotation direction of the targets 121. From this fact, it was understood that the Example 1 has such an effect, which can improve the film thickness distribution more excellent than the effect of the Example 2. That is, as for the rotation direction of the pair of the targets 121, it is indicated that a case of the combination of the same direction and the reverse direction or the reverse direction and the same direction is better than the combination of both the same directions or both the reverse directions to the conveying direction of the substrate 106.

Example 3

When the film deposition speed is uniformized, a case of using a plasma emission will be indicated. The optical emission in the plasma is collected by use of the each optical emission monitor 111 having a collimator lens in the electric discharge period, and the optical emission spectrum was obtained through the spectroscope 112 via an optical fiber. The spectroscope 112, of which the wavelength range is 200 to 1100 [nm] and the wavelength resolution is 1.4 [nm], was used. The optical emission intensity of the wavelength (288 [nm]) related to the metal material Si was obtained from the optical emission spectrum in the electric discharge period. The optical emission intensity, which is expressed by the count, is a relative index of which the value is changed by the disposal, the obtaining interval and the integrated time of the optical emission.

The data collection is performed by the controlling apparatus 130 which is connected to the spectroscope 112 by an USB (Universal Serial Bus). Here, the optical emission intensity (optical emission amount) is used as the amount which depends on the film deposition speed.

Figure 8:
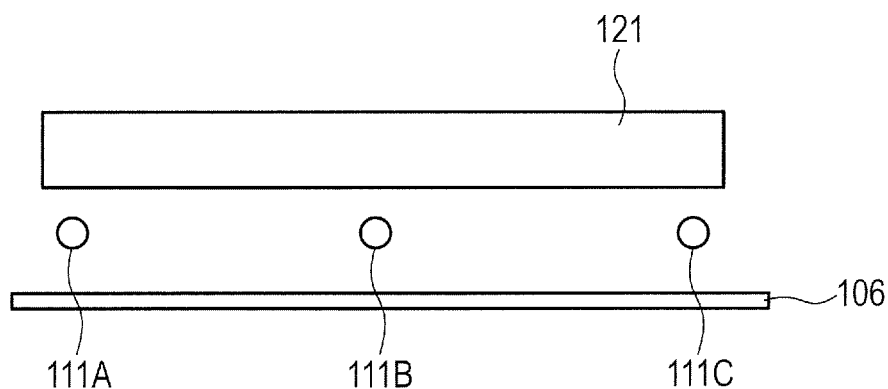
FIG. 8 is a diagram for describing the installation place of the optical emission monitor of obtaining the emission spectrum in Example 3.

FIG. 8 is a diagram for describing the installation place of the optical emission monitor of obtaining the optical emission spectrum in the Example 3. As illustrated in FIG. 8, the optical emission monitor 111B is disposed in the vicinity of the center position of the target 121 and the optical emission monitors 111A and 111C are respectively disposed in the vicinity of end portions of the target 121. As for the installation places of the optical emission monitors 11A and 11C, it is desirable to dispose them in the vicinity of the most end portions of the target 121 for depositing the film thickness necessary for the substrate 106. In the Example 3, the installation places of the optical emission monitors 111A and 111C are set as such portions disposed on the both sides respectively having the distance of 900 [mm] from the center of the target 121. The driving units 104 may control the rotation speed (including the rotation direction) of the targets 121 such that the optical emission intensity obtained by the optical emission monitors 111A to 111C, which were respectively disposed on the three portions, becomes the preset target intensity.

The optical emission intensity ratio of the wavelength (288 [nm]) related to the metal material Si between a case that the rotation direction of the targets 121 is in a state that the both the two pieces of the targets 121 are rotated with the same direction to the conveying direction of the substrate 106 and a case that the rotation direction of the targets 121 is in a state that the both the two pieces of the targets 121 are rotated with a combination of the same direction and the reverse direction to the conveying direction of the substrate 106 is indicated in Table 1.

TABLE 1

|  | Optical emission intensity ratio |
|---|---|
| Optical emission monitor 111A | 1.03 |
| Optical emission monitor 111B | 1.00 |
| Optical emission monitor 111C | 1.01 |

The numerical values in Table 1, which are optical emission intensity ratios of the respective optical emission monitors 111A to 111C, are such the numerical values obtained by comparing the optical emission spectrum in the Example 2 with the reference by treating the optical emission spectrum in the Example 3 when the film thickness distribution is equal to or less than ±4 [%] as the reference. As the experiment condition, the Ar gas flow rate was set as 300 [sccm]. The length of the reactive gas flow unit 105, which flows the $O_2$ gas, at the center portion was set as 1130 [mm] and the length of the reactive gas flow units 105 at the both ends portions was set as 490 [mm]. The $O_2$ gas supply amount of the reactive gas flow unit 105 at the center portion was set as 32.5 [sccm], and the $O_2$ gas supply amount of the reactive gas flow units 105 at the both ends portions was set as 6.5 [sccm].

The total pressure of the vacuum chamber 102 was made constant at 1.0 [Pa], and the AC voltage was applied to the pair of the targets 121 by the AC power supply 107 by treating two pieces of the targets 121 as one pair of the targets, and the electricity of 6,000 [W] was applied to the pair of the targets 121. The rotation speed of the pair of the targets 121 was fixed at 20 [rpm] for the both targets.

In case of the Example 2, in which the rotation direction is the same direction, it is indicated that the intensity ratio of the optical emission spectrum increases depending on the level of the film thickness and the film deposition speed increases due to the deviation of plasma density unique to the above-described long targets from Table 1. According to this result, the effect of uniformizing the film thickness distribution can be confirmed by changing the rotation speed of the targets 121 by use of the plasma emission.

Figure 9:
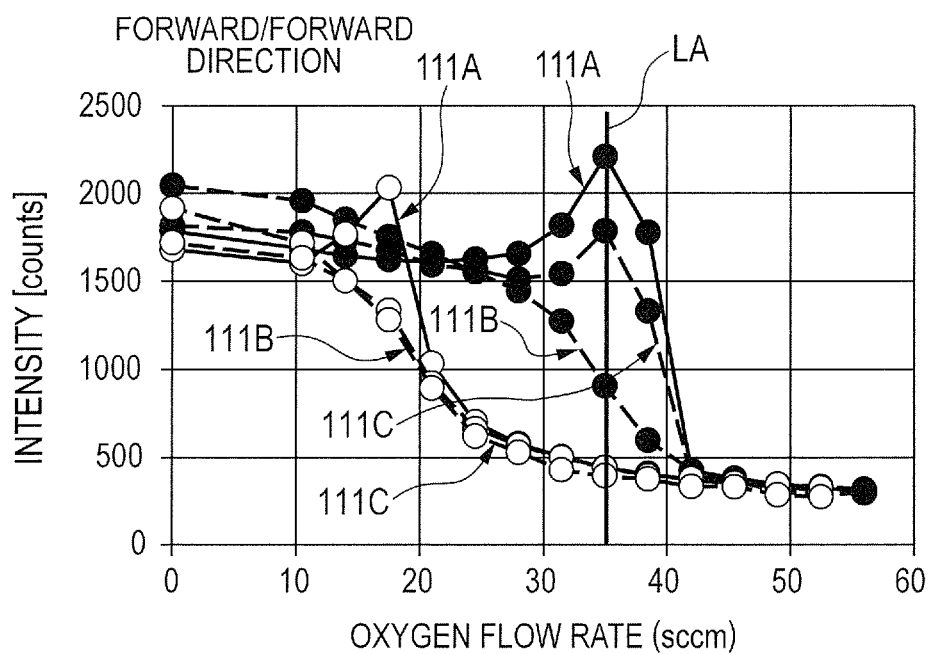
FIG. 9 is a graph for describing the result obtained by measuring, with the optical emission monitor, the optical emission intensity at the time when increasing and decreasing the $O_2$ gases supplied from the reactive gas flow unit at the center, on the film deposition condition of the Example 2.
Figure 10:
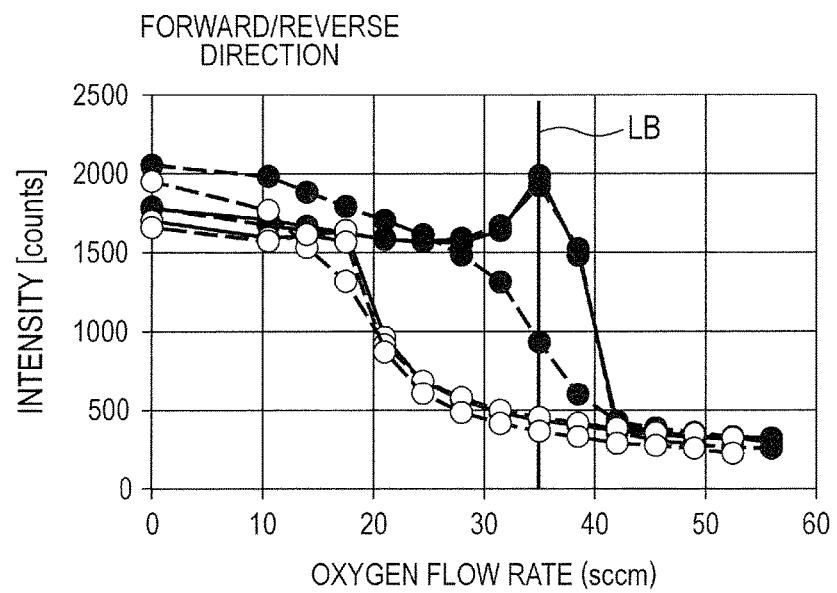
FIG. 10 is a graph for describing the result obtained by measuring, with the optical emission monitor, the optical emission intensity at the time when increasing and decreasing the $O_2$ gases supplied from the reactive gas flow unit at the center, on the film deposition condition of the Example 3.

FIG. 9 is a graph for describing the result obtained by measuring, with the optical emission monitors 111A, 111B and 111C, the optical emission intensity at the time when increasing and decreasing the $O_2$ gas supplied from the reactive gas flow unit 105 at the center, on the film deposition condition of the Example 2. FIG. 10 is a graph for describing the result obtained by measuring, with the optical emission monitors 111A, 111B and 111C, the optical emission intensity at the time when increasing and decreasing the $O_2$ gas supplied from the reactive gas flow unit 105 at the center, on the film deposition condition of the Example 3. Incidentally, the $O_2$ gas supplied from the reactive gas flow unit 105 at the center portion was increased and decreased at the flow rate of 0 to 56 [sccm]. The optical emission intensity of the wavelength (288 [nm]) related to the metal material Si was measured by the optical emission monitors 111A, 111B and 111C.

White circles in FIGS. 9 and 10 indicate the optical emission intensity when the $O_2$ gas amount is changed so as to be decreased. Black circles in FIGS. 9 and 10 indicate the optical emission intensity when the $O_2$ gas amount is changed so as to be increased.

As to the rotation direction of the pair of the targets 121, in a case that the pair of the targets 121 are rotated to the forward/forward direction as in the Example 2, when the flow rate is at 35 [sccm] (LA) so as to decrease the $O_2$ gas flow rate (white circles), it is indicated that the optical emission intensity is significantly different depending on the optical emission monitors 111A, 111B and 111C. As for this result, it is observed that the oxygen coating ratio was different in the vicinity of the targets 121 and the film deposition speed was changed as described before. On the other hand, as in FIG. 10, in the Example 3, when the flow rate is at 35 [sccm] (LB) so as to decrease the $O_2$ gas flow rate (white circles), the optical emission intensity in the vicinity of the targets 121 is coincided, and the effect that the film deposition speed becomes uniform depending on the rotation direction is proved.

Figure 11:
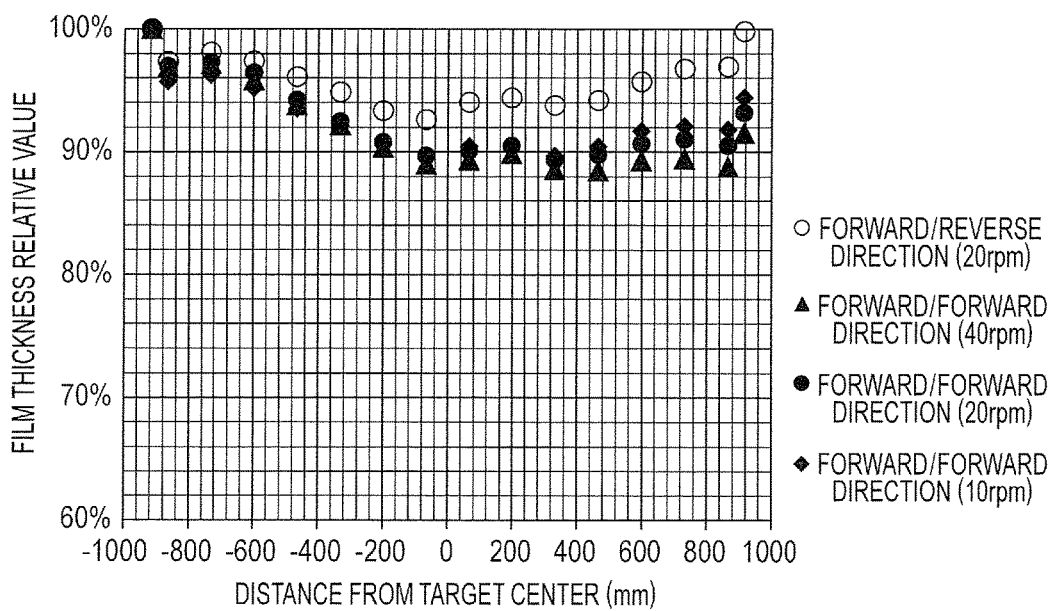
FIG. 11 is a graph for describing the result obtained by comparing the relative values of the film thickness distributions in the width direction of the substrate, at the time when changing the rotation direction of the pair of the targets on the film deposition condition of the Example 3.

FIG. 11 is a graph for describing the result obtained by comparing the relative values of the film thickness distributions in the width direction of the substrate 106, at the time when changing the rotation direction of the pair of the targets 121 on the film deposition condition of the Example 3. In FIG. 11, the result of the relative value of the film thickness distribution in the width direction of the substrate 106 when the pair of the targets 121 are rotated in the forward/forward direction and the rotation speed is changed to 10 [rpm], 20 [rpm] and 40 [rpm] is indicated, and the result of the relative value of the film thickness distribution in the width direction of the substrate 106 when the pair of the targets 121 are rotated in the forward/reverse direction and the rotation speed is set as 20 [rpm] is indicated. From FIG. 11, it is indicated that the film thickness distribution of the substrate 106 is changed by controlling the rotation speed of the targets 121. This fact indicates that the surface oxygen coating ratio of the targets 121 can be controlled also by the rotation speed and indicates that the uniformization of the film thickness distribution in the width direction of the substrate 106 depending on the rotation speed can be attained.

As described above, according to the uniformization of the film deposition speed in the width direction of the large-size substrate 106 in the reactive sputtering, it becomes possible to deposit the optical film or the insulation film which is excellent in productivity and has high quality.

According to the present invention, when the reactive sputtering is performed by using the cylindrical target, the film thickness distribution in the conveying direction and the direction perpendicular to the conveying direction of the film deposited on the substrate can be uniformized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-087616, filed Apr. 22, 2015, which is hereby incorporated by reference herein in its entirety.

What is claimed is:

1. A film deposition method by which a circumferential surface of cylindrical target rotatively driven by a driving unit is opposite to a substrate, the target is disposed in vacuum chamber such that a rotation axis of the target intersects a conveyance direction of the substrate, a reactive gas is supplied from a reactive gas flow unit, disposed at a location farther than the rotation axis of the target from the substrate and configured to flow the reactive gas to the side of the substrate, when depositing a film on a surface of the substrate by a magnetron sputtering, and an optical emission intensity of plasma is monitored by an optical emission monitor at a location between the substrate and the target and in the vicinity of the target, the film deposition method comprising:
   obtaining the optical emission intensity monitored by the optical emission monitor; and
   controlling a rotation speed of the target driven by the driving unit, such that the obtained optical emission intensity approaches a preset target optical emission intensity, wherein a plurality of optical emission monitors are disposed respectively at intervals in a direction of the rotation axis of the target, and
   wherein, in the controlling of the rotation speed, the rotation speed of the target is controlled such that each of the optical emission intensities monitored by the plurality of optical emission monitors is kept within an allowable range of the target optical emission intensity.

2. A film deposition method by which a circumferential surface of cylindrical target rotatively driven by a driving unit is opposite to a substrate, the target is disposed in vacuum chamber such that a rotation axis of the target intersects a conveyance direction of the substrate, a reactive gas is supplied from a reactive gas flow unit, disposed at a location farther than the rotation axis of the target from the substrate and configured to flow the reactive gas to the side of the substrate, when depositing a film on a surface of the substrate by a magnetron sputtering, and an optical emission intensity of plasma is monitored by an optical emission monitor at a location between the substrate and the target and in the vicinity of the target, the film deposition method comprising:
   obtaining the optical emission intensity monitored by the optical emission monitor; and
   controlling a rotation speed of the target driven by the driving unit, such that the obtained optical emission intensity approaches a preset target optical emission intensity, wherein a plurality of optical emission monitors are disposed respectively at intervals in a direction of the rotation axis of the target, and
   wherein, in the controlling of the rotation speed, the rotation speed of the target is controlled such that an average value of the optical emission intensities monitored by the plurality of optical emission monitors approached the target optical emission intensity.

* * * * *